United States Patent [19]

Sonnenschein et al.

[11] Patent Number: 5,043,251
[45] Date of Patent: Aug. 27, 1991

[54] PROCESS OF THREE DIMENSIONAL LITHOGRAPHY IN AMORPHOUS POLYMERS

[75] Inventors: Mark F. Sonnenschein, Arlington, Va.; Charles M. Roland, Waldorf, Md.

[73] Assignee: The United States of America as represented by the Secretary of the Navy, Washington, D.C.

[21] Appl. No.: 442,815

[22] Filed: Nov. 29, 1989

[51] Int. Cl.$^5$ .............................................. G03C 5/00
[52] U.S. Cl. ..................................... 430/297; 430/321; 430/396; 430/944; 430/945
[58] Field of Search ............... 430/297, 321, 396, 944, 430/945

[56] References Cited

U.S. PATENT DOCUMENTS 4,486,463 12/1984 Rubner et al. .................... 427/53.1
4,975,358 12/1990 Sonnenschein et al. ............ 430/495

OTHER PUBLICATIONS

Novotny et al., "Light-Induced Phenomena in Dye-Polymer Systems", J. Appl. Phys. 50(3), Mar. 1979, pp. 1215–1221.
Andrew et al. "Direct Etching of Polymeric Materials Using a XeCl Laser", Appl. Phys. Lett. 43(8), Oct. 15, 1983, pp. 717–719.
Srinivasan et al., "Ablative Photodecomposition of Polymer Films by the Pulsed Far-Ultraviolet (193 nm) Laser Radiation Dependence of Etch Depth on Experimental Conditions" Journal of Polymer Science: Polymer Chemistry Edition, 22, pp. 2601–2609, (1984).
Pearson, "Polymeric Optical Disk Recording Media", CRC Critical Reviews in Solid State and Materials Sciences, 13(1), pp. 1–26, (1986).
Fang et al. "Laser Annealing of Polyetheretherketone (PEEK)", Polymer Engineering & Sciences, vol. 29, No. 18, pp. 1241–1245, Sep. 1989.

Primary Examiner—Charles L. Bowers, Jr.
Assistant Examiner—Janet C. Baxter
Attorney, Agent, or Firm—Thomas E. McDonnell; Barry A. Edelberg

[57] ABSTRACT

A process of three dimensional lithography in amorphous polymers to form an instantaneous, permanent image in the polymer by the steps of providing an undoped, non-crystalline layer or film of a polymer having a stable amorphous state under human operating conditions. The film is preferably poly(ethyleneterphthalate) (PET), poly(aryl-ether-ether-ketone) (PEEK), poly(chloro-trifluoroethylene) (Kel-F ®), poly(carbonate) (ie LEXAN 9032 ®), poly(sulfone), poly(methylmethacrylate(PMMA, or LUCITE ®), a poly(cyanurate) such as bisphenol A dicyanate, or an epoxy (eg. Epon 820 ®). The film can be either self supporting or mounted on a substrate. The film is then covered (and optionally contacted) with a mask which serves to block the radiation from impinging on where no marking is desired. If the mask is in actual contact with the film, it is capable of also acting as a heat sink. Next, the film is exposed through the mask to radiation of sufficient intensity to cause ablation of the exposed areas imparting a distinct, three-dimensional impression in the film. The film may then, for example, be processed by metalization and coating with a protective layer to form a finished product of an optical data storage disk.

24 Claims, 1 Drawing Sheet

PROCESS OF THREE DIMENSIONAL LITHOGRAPHY IN AMORPHOUS POLYMERS

BACKGROUND OF THE INVENTION

1. Field of the Invention

This invention relates to a process of three dimensional lithography in amorphous polymers to form an instantaneous, permanent image in the polymer. More particularly, the invention relates to a process of imprinting permanent optical data readable images, through a mask, with infrared energy.

2. Description of the Prior Art

The development of media for the optical recording of digital and image information has been a topic of active investigation for the past several years. In the storage of digital information the desired result is achieved by selectively creating pits, cracks, or bubbles in an organic or inorganic medium. One area for the commerical application of optical data storage is making video disks for the reproduction of movies and compact disks (CD) for the reproduction of music and voice. Of course, today, CD's are also used for the storage of images such as book pages, drawings, photographs and the like.

Industrial production of compact discs involves creating a metal master die and stamping out polycarbonate disks with the master to create the desired array of pits. The stamped discs are then metalized and coated with a protective layer. Such systems are illustrated in U.S. Pat. No. 4,141,731 issued to Jarsen on 27 Feb. 1979 and U.S. Pat. No. 4,615,969 issued to Strand on 7 Oct. 1986.

The master die has a limited lifetime. Repeated pressings dull the die and affect the quality of sound reproduction. An alternative is needed which will permit the rapid, reproducible "printing" of optical data, particularly CD disks without the attendant deterioration of the "printing" instrument.

An alternative to creating the "marks" in the polymer with a metal die is to "print" the image by some form of a lithographic process. In such a process, images are usually produced by taking advantage of the photosensitivity of the substrate or, more commonly, on a compound coated on the substrate. The material will acquire the "written" image by several mechanisms including solubilization or insolublization of exposed areas and ablation of exposed areas. The compounds utilized for these purposes are patented mixtures of polymers and additives.

In a related application by the same inventors as this application a process is described of reversibly writing on an amorphous polymer surface. The related application is titled, "Immediate Write, Read, and Erase Optical Storage Medium and Method of Marking", U.S. patent application Ser. No. 07/422,723 filed 16 Oct. 1989, now U.S. Pat. No. 4,975,358. The present invention is an extension of the methods described in the previous application to the permanent marking of the polymer film.

The prior art describes many attempts to develop an optical writing method. Pearson, in an article titled "Polymeric Optical Disk Recording Media", *CRC Critical Reviews in Solid State and Material Science*, Vol. 13, pp. 1-26 at page 1 (1986) stated > High-Speed, instantaneous optical recordings by use of a laser is finally emerging from the laboratory as a powerful new technology for information storage. The technique offers the capability for low-cost-high-capacity data storage with rapid, random-access retrieval.

As the demand increases for improved techniques for both permanently writing data and for writing/erasing data, the search continues for materials which can alternately provide permanent recording (ROM) capabilities and materials which can provide write and erase capabilities. Polymeric optical disks are emerging as one of the leading candidates for such a recording medium.

The Pearson article infra excellently summarizes the state-of-the-art in the field and presents the criteria for an acceptable medium including:

1) High-marking sensitivity at an appropriate wavelength coupled with long-term stability of the recording medium and the recorded information;
2) High signal-to-noise ratio (SNR) of the recorded information to facilitate data retrieval;
3) Low defect density level to minimize errors;
4) Substantially instantaneous readability (microseconds) following the marking event (direct read after write [Draw]).

These criteria eliminate materials requiring post image processing or slow image development.

A vast number of polymers and modified polymers to meet these criteria have been suggested, but a fully satisfactory solution has not been found.

An optical reading system usually comprises a means of projecting light at the recorded surface and a means of detecting the reflections from the surface. The data stored for optical reading must be marked onto the storage medium in such a way that the reading light projected at the surface can be varied or broken up to cause changes in signal corresponding to the nature of the data.

Basically, there are four types of changes in the surface character used with polymeric optical disks. The first is to form a shallow pit. The second is to form a deep pit. The third is to form a blister and the fourth is to cause changes the optical but not the chemical characteristics of the surface.

The first three methods usually permanently deform the surface. In two of these ("ablative techniques"), material is either displaced or moved to the side by localized heating of the material. In the case of the deep pit, material is literally blasted out or removed from the localized area. The ablative techniques are most useful for permanent markings.

In the blistering technique, a bubble or bump is formed in the material itself or at the interface of a sandwich or composite of material. These techniques are usually Read-Only (ROM) techniques.

The fourth technique changes the optical characteristics of a localized area. This may be done by having dyes embedded in the polymers which dyes will convert between an amorphous and a crystalline state causing a change in the color or clarity of the polymer or by changing the materials themselves. Pearson, infra at page 16, describes the use of dyes in write/erase systems.

It has been suggested that dyes can be used in polystyrene oligomer to form a write/erase medium. This system is an ablative system in which a pitted surface can be regenerated to a smooth surface by heating the polymer. Of course, a little material is lost in each cycle so the number of repetitions is limited to the point where a hole is driven through the recording medium. These techniques are described by Pearson, infra, at pages 16 and 17.

Phase change has been shown in the literature for several of the different techniques. In some cases, a polymer is heated rapidly to vaporize some component of the polymer film, forming a bubble. These bubbles may or may not be partially crystalline; the crucial feature is that the bubble material be rigid in order to stabilize the bubble. Materials used in this approach are polymethylmethacrylate (a non-crystallizing polymer), polymethylstyrene, and polycarbonate. Illustrative of these techniques are U.S. Pat. No. 4,360,895 (1982) to Cornet and European patent No. 58,496 to Maffit, Robbins, and Wilson (1982). An optical data storage system described by Willis in U.S. Pat. No. 4,264,986 employs a similar concept but adds the erase feature. Images can be erased by heating the rigid bubble to a high temperature, whereby the resilience of the material allows it to contract, followed by rapid quenching of the polymer back to a rigid state. A similar approach is described by Lind et al. in U.S. Pat. Nos. 4,780,867 and 4,719,615.

Another phase change recording layer is disclosed in Japanese Patent No. 58-199,345 to Ota, K. (1984). The active medium consists of a transition metal diketonate dispersed in a polymer matrix. Within the polymer, light sensitive domains comprised of the metal diketonate can be converted from the amorphous to the crystalline state with a pulsed $N_2$ laser. The image formed can be erased by heating.

Small molecule (i.e., non-polymeric) inorganic materials such as oxides of tellurium (Takenaga et al., *J. Appl. Phys.*, 54, p. 5376, (1983)), alloys of GeTe, SeTe, and ternary alloys such as varying ratios of TeGeSb (Ovshinsky and Fritzsche, *IEEE Transactions on Electron Devices*, 20, p. 91, (1973)) are capable of being switched from the amorphous to crystalline state by application of a short pulse of electricity or light. These non polymeric materials can be repeatedly cycled. This work is further developed in 133 patents issued to S. R. Ovshinsky. These are exemplified by U.S. Pat. Nos. 4,226,898, and 4,217,374.

There are many patents and articles which describe ablative techniques. Novotny and Alexandru, *J. Appl. Polymer Science*, Vol 24, pp. 1321-1328 (1979), describe a dye-polymer system based on the thermal diffusion of the dye into a PET (Mylar) film substrate following exposure to 1 microsecond of 32 milliwatt 5145 Å (angstrom) radiation. The small dye spots, whose spatial profile is similar to that of the exciting beam, can then be read by a variety of means. Murthy, Klingensmith, and Michl, *J. Appl. Poly. Sci.*, 31, p. 2331, (1986), describe a method of optical data storage that involves exposure of deformed (stretched) poly(vinyl chloride)-dye films to laser radiation at 823 nm. The heating caused a loss of film birefringence which can be detected by a variety of means.

Lind et al. in U.S. Pat. No. 4,780,867 describes an optical recording mechanism whereby an initially amorphous polymer (an expansion layer) is adhered to a substrate (a retention layer). Bubble formation creates a localized deformation. This deformation can then be erased by reheating the polymer expansion layer and using the shear deformation induced by its attachment to the retention layer to "pull" the surface smooth. A similar disclosure appears in U.S. Pat. No. 4,719,615 by the same assignee.

The marking of polymer films with three dimensional resolution is described in the patent literature of photoresist technology. Recent reviews of this field include: C. G. Willson and M. J. Bowden in *Electronic and Photonic Applications of Polymers*, Adv. Chem. Ser., American Chemical Society, Vol. 218, 1988, Chapter 2; *Symposium on Polymers in Information Storage Technology, Polymer Preprints*, Vol. 29, p. 195, 1988; *Symposium on Polymers in Microlithography, Polymeric Materials: Science and Engineering*, Vol. 60, p. 40 1989. These processes differ from optical data recording because:

they have a chemical development step in the production of an image;

the materials used are not commercially available and inexpensive;

they are constrained to a particular wavelength;

the theoretical resolution is less than 1000 Å and the demonstrated resolution is less than 10,000 Å (1 $\mu$);

The lithography art has utilized differences in reactivity on a polymer surface created by exposure of a polymer to heat to "process" an image. Rubner, in U.S. Pat. No. 4,486,463, describes a process for the selective metal plating of RYTON ®, a clay filled poly[phenylene sulfide] sold by Phillips. The RYTON ® polymer surface is exposed through a mask to heat generated by a $CO_2$ laser. An image is generated which is sequentially made hydrophilic, catalyzed, doped to deactivate catalyst in certain regions and selectively metal plated by electroless plating. Rubner utilizes the change in state of RYTON ® from amorphous to crystalline to create regions in which the dopant is excluded in order to form the image. RYTON ® does not provide sharp images because the laser generated heat is rapidly and efficiently dissipated to the surrounding polymer.

Image storage via ablation of polyethylene is described by Kuder et al., *J. Appl. Polym. Sci*, 35, p. 1257 (1988). Kuder exposes prepared film to intense radiation from a HeNe laser resulting in 10 micron holes. Bell describes forming high resolution pits in inorganic layers of Ti/MgF$_2$/Al, Bell, A. E. *J. Appl. Phys*, 53, p. 3438 (1982). Howe and Wrobel., *J. Vac. Sci. Technol.*, 18, p. 92, (1981), describes the use of laser induced ablation in dye-polymer-Al structures.

There is a preference in the optical data storage field to use shortwave lengths in the UV or far UV range because of the belief that these wavelengths are necessary to obtain sharp images. The belief is that the size of the image can't be less than the wave length of the radiation used to imprint. The reasons for this preference are explained by Iwayanagi et al., "Materials and Processes for Deep-UV Lithography", *Electronic and Photonic Applications of Polymers*, Adv. Chem. Ser., American Chemical Society, Vol. 218, 1988, Chapter 3, at pages 109-110. Srinivasan et al., *Appl. Phys.*, 41, No. 6, pp. 576-578, 15 Sept. 1982, exemplifies the use of UV to form an image. In addition, in U.S. Pat. No. 4,417,948, Srinivasan and Mayne-Banton describe a deep ultra-violet wavelength technique for photomarking polyester films (including PET) which is reported to work in reactive or inert atmospheres. These are ablative techniques based on photoetching techniques.

Andrew et al., in an article titled "Direct Etching of Polymeric Materials Using a XeCl Laser", *Appl. Phys. Lett.*, 43(8), pp. 717-719, 15 Oct. 1983, suggests that the UV etching in PET "is primarily due to a thermal process." (at page 717). As proof, Andrew et al. states "It is relevant to note that consistent with the proposed thermal model a similar structure to that in FIG. 2 was revealed by "etching" using a 30-ns TEA $CO_2$ laser turned to a strong absorption band in PET. The excimer laser is thus not unique in its ability to etch and reveal microstructure but has the advantages of short penetration depth, short pulse length, and a low threshold fluence which allows very controllable material removal. "Andrew et al. at page 719."

E. O. Chiello, F. Garbassi, and V. Malatesta, *Appl. Macromolecular Chem. and Physics*, 169, p. 143, (1989), describe using a $CO_2$ laser to irradiate what are initially opaque PEEK films (0.25 mm thick). The irradiation causes hole formation (>30s at 100 W) or surface disruption by deformation and melting (<20s at 10 W). In the latter case, the deformation resulted in "the only relevant feature is some corrugation of the surface, probably due to microfusion events". The authors noted that the low power irradiation caused melting and that upon turning off the laser "the polymer remained deformed, but the treated zone required (sic) the original opaque appearance." Recently, Fang et al., *Polymer Engineering and Science*, Vol. 29, No. 18, pp. 1241–1245 (September 1989) at p. 1245, noted the phenomena which is the basis of this application. Fang does not teach how to effect the expressed desired result.

SUMMARY OF THE INVENTION

Accordingly, it is an object of this invention to accurately and consistently imprint a three dimensional image into a polymer surface.

Another object of the invention is a process for mass producing consistent high quality optical data storage recordings.

A further object of this invention is a process using simple available techniques and materials.

Yet another object of the invention is a process producing high resolution recorded images.

These and additional objects of the invention are accomplished by providing an undoped, non-crystalline layer or film of a polymer having a stable amorphous state under human operating conditions. The film is preferably poly(ethylene terephthalate) (PET), poly(aryl-ether-ether-ketone) (PEEK), poly(chloro-trifluoroethylene) (Kel-F®), poly(carbonate) (i.e. LEXAN 9032®), poly(sulfone), poly(methylmethacrylate)(PMMA, or LUCITE®), a poly(cyanurate) such as bisphenol A dicyanate, or an epoxy (e.g. Epon 820®). The film can be either self supporting or mounted on a substrate. The film is then covered (and optionally contacted) with a mask which serves to block the radiation from impinging on where no marking is desired. If the mask is in actual contact with the film, it is capable of also acting as a heat sink. Next, the film is exposed through the mask to radiation of sufficient intensity to cause ablation of the exposed areas imparting a distinct, three-dimensional impression in the film. The film may then, for example, be processed by metalization and coating with a protective layer to form a finished product of an optical data storage disk.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS

Figure 1:
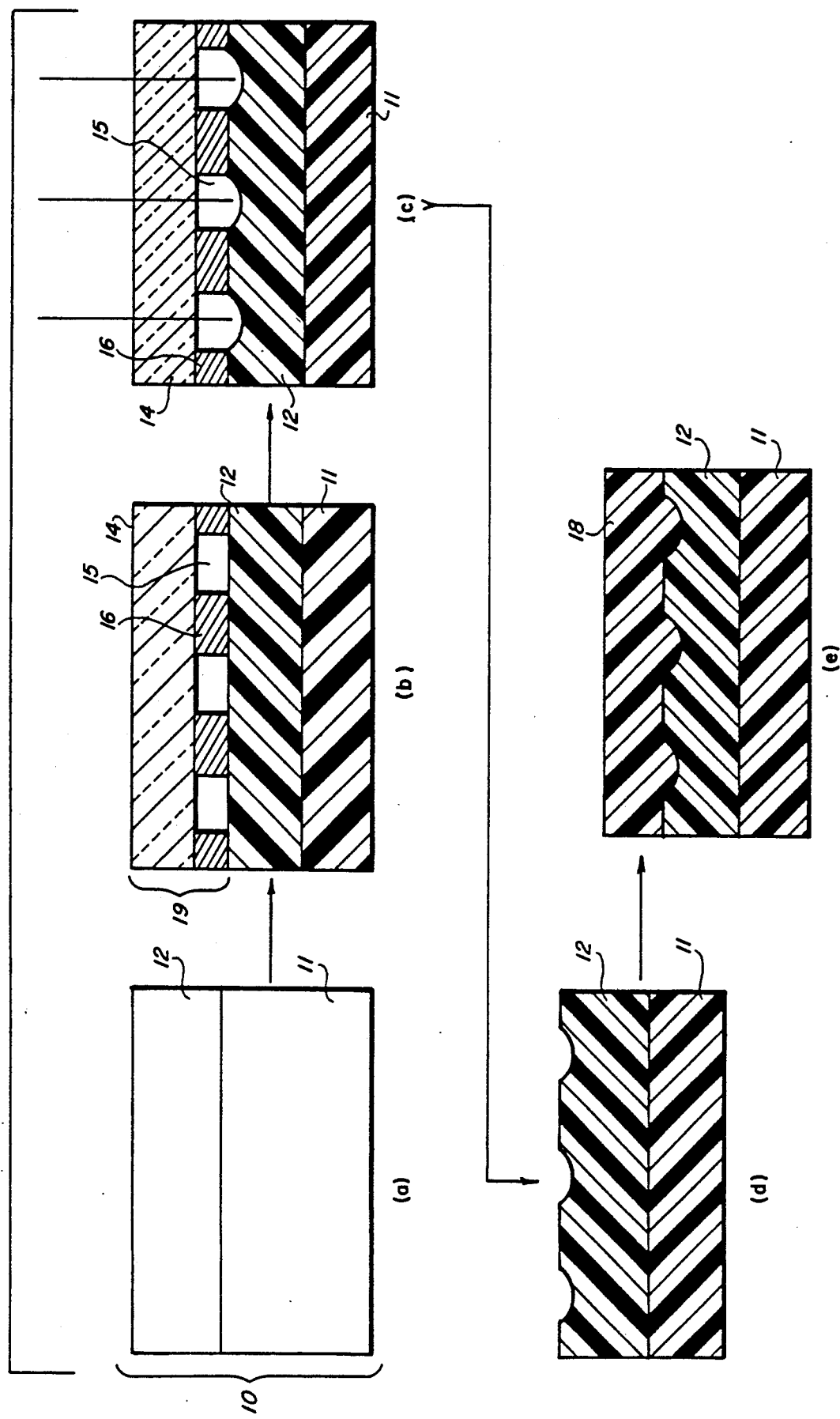
FIG. 1 is a flow diagram in steps a through e of the process of the invention.

The process of this invention provides for the high resolution marking of an undoped, amorphous layer or film of a polymer having a stable amorphous state under human operating conditions. The amorphous film exists in a stable amorphous state throughout a range of temperatures extending from arctic temperatures to desert temperatures. The glass transition point and melting points should be substantially above temperatures tolerable to humans such as above 70° C. Preferably, the film is poly(ethylene terephthalate) (PET), poly(aryl-ether-ether-ketone) (PEEK), poly(chloro-trifluoroethylene) (Kel-F®), poly(carbonate) (i.e. LEXAN 9032®), poly(sulfone), poly(methylmethacrylate)(PMMA, or LUCITE®), a poly(cyanurate) such as bisphenol A dicyanate, or an amorphous epoxy (e.g. Epon 820®). The present process produces three dimensional impressions of mask images for the purpose of storing digital or analog information. These impressions can be selectively metallized by any of the known techniques for metallizing. Preferably, the disk is metalized by using using the well known vapor deposition techniques.

The process of the present invention is easily adapted to automated, mass production techniques using existing lithographic technology and readily available materials. Under an automated system, the process will produce consistent accurate reproductions of the mask image without the variations usually experienced in a stamping process.

In the preferred embodiment amorphous films of undoped PET or polycarbonate are provided either forming the disk support structure itself or more preferably as a film mounted on a support substrate. The substrate is any substrate used to give body to the assembly, including simply in one embodiment the polymeric recording medium itself in the form of a relatively thicker film which will not fold or crinkle to change the image. The substrate can be any of the materials ordinarily used for video and compact disks.

The exact thickness of the film mounted on the substrate is not critical. The film must be thick enough to form the three-dimensional image which is usually a depression in the film of a denser, crystalline material. Typically, the film is about 125 microns thick.

The film mounted on the substrate is illustrated in step (a) of the flow diagram, FIG. 1. The structure as a whole is 10. The film is 12 and the substrate, when of different material than the film is illustrated by 11.

In the second step, (b), the assembly 10 is covered and in contact with a mask 19 possessing the desired image(s). The mask 19 is constructed of a wafer 14 that efficiently transmits the wavelength of the radiation used. On the side of the wafer 14 (and optionally in contact with the polymer film 12) resides an opaque layer 16 which reflects radiation of the wavelengths used in this process. The layer 16 is preferably metal although any layer capable of both reflecting the projected radiation and absorbing heat is suitable. In the most preferred embodiments, the layer 16 is gold and serves as a heat sink by virtue of its contact with the film 12. The layer 16 has an image 15 in the form of transparent openings in the layer 16.

In the next step, (c), the mask is irradiated with heat producing radiation (preferably infrared laser light) for approximately 10 to 100 seconds; usually an exposure of ca. 30 seconds is sufficient. Longer or shorter exposures are also usable depending on the nature of the image and the material of film.

The power levels used to "burn" an image can also vary with the nature of the image and the material of the film. Power levels should ordinarily be between 3.5 and 10 watts/cm$^2$. The power levels must exceed about 1.8 watts/cm$^2$ to be sufficiently strong enough to ablate the amorphous film. The power levels should not exceed the point where melting is caused. The exact power level needed is best obtained by empirical testing with the polymer and heat source. The parameters which must be met are sufficient power to cause ablation and not sufficient power to cause melting. Of course, the variance of powertime product (power and time of exposure) may allow the use of higher powers for briefer times. Most preferably power levels employed are 4 watts for PET and 4.5 watts for PEEK.

As shown in (c), the light unblocked by the mask 19 rapidly heats the film 12. This exposed material ablates while the unexposed areas are unaffected, leaving a three dimensional image 13 FIGS. 1(c) and 1(d) in the film 12. If the polymer film is covered by but is not in contact with the radiation-blocking mask, heat dissipation of the non-irradiated regions is achieved by ambient air cooling.

Higher incident intensities are used for this technique compared to the intensities used in U.S. patent application 07/422,723 filed 16 Oct. 1989, now U.S. Pat. No. 4,975,358. The ablation of this invention is taking place at an elevated power than the crystallization in technique described in the companion case. This higher power affords the energy for chemical reactions to occur, perhaps of the type described by Day and Wiles (*J. Appl. Poly. Sci*, 16, 191, 1972) and by Srinivasan and Leigh (*J. Am. Chem. Soc.*, 104, 6784, 1982) for the multiphoton UV stimulated decomposition of poly(ethyleneterpthalate). Contrast is imposed relative to the surrounding unheated material in these thin films. This latter material is directly underneath (and preferably in contact with) the covered or metallized portions of the mask 19. This covered or metallized portion 16 of the mask 19 reflects the radiation away from the underlying material, and can also act as a heat sink to ameliorate heating by lateral thermal diffusion from the directly irradiated regions. A distinct temperature gradient exists between the radiated and unheated regions; the latter are sufficiently shielded from IR exposure that its loss of material, as well as any physical changes, are minimal.

The resulting ablated images 13 in the exposed portion of the PET or PEEK take the form of distinct impressions (FIG. 1d). It is believed that ablation with a high incident power in combination with the maintaining of a low energy in the unexposed regions (by virtue of the metal acting as a shield and also preferably a heat sink) enables production of three dimensional images. The high temperature within the imaged regions along with the temperature gradient at the borders are crucial in development of this topography.

In all experiments to date, the three dimensional marks have exhibited identical resolution as the finest available mask images (one micron), and are without defect as judged by optical and scanning electron microscopies. The walls bordering the impressions are sharp, suggesting that the ultimate resolution limits are likely finer than one micron. It has been observed that the transition from an unmarked region to the depth of the impression can occur over less than a 0.1 micron distance.

Once the image is formed an optional metal layer can be placed over the film 12 and marks 13. The metal layer can be applied by techniques used for metal coating polymers such as vapor phase deposition and electoless plating. This metal layer is perhaps more needed for customer acceptance than operability.

Lastly, a protective layer 18 (illustrated in (e)) of the materials commonly used in this field can be applied by the usual techniques to form a finished disk. The protective layer 18 is an optically clear layer which has sufficient hardness to reduce or eliminate scratches and provide an optically clear transmission medium. The protective layer could be any of the polymers now used or that will be used on optical storage discs. These latter include materials comprising the film used herein; accordingly, a simplified construction can be attained. The protective layer must be optically clear and relatively hard.

Having described the invention, the following examples are given to illustrate specific applications of the invention including the best mode now known to perform the invention. These specific examples are not intended to limit the scope of the invention described in this application.

EXAMPLE 1

Amorphous PET film, 0.005 inch thick, was irradiated with 4 watts/cm$^2$ CW laser radiation for 20 s, through a light field gold on GaAs mask with features ranging in size from 4 to 500 microns in size with equally varying spaces between images. Features consisted of boxes, lines, circles, circles within circles, and lettering. The mask was in contact with the PET film. Three dimensional images produced on the film by irradiation through the mask were observed with a light microscope using dark field optics. Spaces between the impressions were left unmarked. The film was not substantially birefringent when viewed between crossed polarizers. Observation with a scanning electron microscope showed that the three dimensional figures possessed straight walls and slightly bowed bottoms.

EXAMPLE 2

An experiment similar to that of Example 1 was performed except with varying powers and times of exposure. It was found that selective ablation of the film and production of three dimensional figures with optimal contrast was obtained by slightly lowering the power and increasing the exposure, or increasing the power and decreasing the exposure time. Furthermore, if the power was dropped below 1.8 watts CW, no three dimensional figures could be obtained for any exposure time, although the film would crystallize to yield two dimensional images.

EXAMPLE 3

An experiment similar to Example 1 was performed except mylar film was used as the polymer film. Mylar film is a commercially available PET film with high transparency and optical clarity despite a high degree of crystallinity (the crystallites are too small to scatter light thus the film is transparent). Small unacceptably poor quality images resulting from ablation of the amorphous regions were obtained. These images were characterized by the appearance of spherulites within the exposed images, and sometimes charring.

EXAMPLE 4

An experiment was performed similar to Example 1 except that a dark field mask was utilized. Impressions "negative" to those in Example 1 were obtained as revealed by inspection of the film by optical microscopy.

EXAMPLE 5

An experiment was performed similar to that in Example 1 except a light field gold on GaAs mask with 1 micron features was utilized. Again, the features possessed by the mask were identically apparent on the film when observed via optical and electron microscopy.

EXAMPLE 6

An experiment similar to that in Example 1 was performed except that 0.003 inch thick amorphous PEEK film was utilized. Exposures of PEEK to 4.5 watts/cm$^2$ CW $CO_2$ laser radiation for 40 s yields the three dimensional images that are represented on the mask.

EXAMPLE 7

An experiment similar to that in Example 1 was performed except with 75 micrometer thick piece of amorphous poly(chloro-trifluoroethylene) with exposure through a mask to 2.5 watts/cm$^2$ $CO_2$ laser radiation for 20 s. Such exposure yielded the three dimensional images represented on the mask, but the film showed some wrinkling as well, perhaps due to stress relaxation induced by heating.

EXAMPLE 8

An experiment similar to that of Example 1 was performed except with a 0.125 inch thick bisphenol A dicyanate resin sample of high cross-link density. Exposure of the sample to 8 watts/cm$^2$ of $CO_2$ laser radiation for 40 s yielded the three dimensional images represented on the mask.

EXAMPLE 9

An experiment similar to that of Example 8 was performed except that the resin possessed a lower cross-link density than that in Example 8. Three dimensional images were obtained at lower powertime products than for Example 8.

EXAMPLE 10

An experiment similar to that of Example 8 except the sample was amorphous epoxy EPON 820 ® (an epoxy) cured for 2 h at 75° C. and 2 h at 125° C. followed by a slow cool. Exposure of the sample through a mask of 7 watts/cm$^2$ for 40 s yielded the three dimensional patterns represented on the mask.

EXAMPLE 11

An experiment similar to that of experiment of Example 8 is performed except the sample was 0.25 inch LEXAN 9034 ® sheet. Exposure of the sample through a mask of 8 watts of $CO_2$ laser radiation for 30 s yielded the three dimensional patterns represented on the mask.

EXAMPLE 12

An experiment similar to that of Example 8 is performed except that the sample was an amorphous 0.14 inch poly(sulfone) sheet. Exposure of the sample through a mask to 6 watts of $CO_2$ laser radiation for 30 s yielded the three dimensional images represented on the mask.

EXAMPLE 13

An experiment similar to that Example 8 is performed except the sample was 0.25 inch poly(methylmethacrylate) sheet. Exposure of the sample through a mask to 8 watts of $CO_2$ laser radiation for 25 s yields the three dimensional images represented on the mask.

EXAMPLE 14

An experiment similar to Example 3 is performed except 0.002 inch poly(ethylene) film was used as the polymer film. This film is highly crystalline at room temperature. No image from ablation of material was obtained.

The process of this invention is a simple technique for the production of high resolution impressions in PET and PEEK and other amorphous polymers. All the polymers are commercially available, have a high glass transition temperature ($T_g > 70°$ C. and 220° C. for PET and highly cross-linked bisphenol A dicyanate resin respectively), and have either no or a high melting point ($T_m > 250°$ C. and 320° C. for PET and PEEK respectively). They are inherently non-crystallizable or, if crystallizable, can be quenched or set into an amorphous state (which serves as the precursor material for the lithographic process) and maintained in this state for extended periods of time (unlike the overwhelming majority of crystallizable polymers). PET shows high adhesion to several metals and these metals may be selectively (and electrolessly) bonded.

Combined with the previous disclosed process, this technique affords new opportunities for fast, efficient and inexpensive writing, reading, and indefinite storage of micron scale analog and digital information. For the purpose of the three dimensional imaging described here, there is no known alternative that has demonstrated this combination of resolution, efficiency, and economy.

Obviously, many modifications of the present invention are possible in light of the above teachings. Within the scope of the appended claims, the invention may be practiced otherwise than as specifically described.

What is claimed is:

1. A process of lithographically imprinting a three dimensional image in a polymer film comprising:
   (a) providing an undoped, amorphous film of a polymer having a stable amorphous state and a glass transition temperature that is higher than normal room temperature;
   (b) covering the amorphous film with a mask containing an image;
   (c) exposing the amorphous film through the mask to infrared radiation of sufficient strength to cause ablation of the exposed areas of the amorphous film thereby imparting a distinct, three-dimensional impression in the amorphous film.

2. The process according to claim 1 wherein the film is selected from the group consisting of poly(ethylene terephthalate) (PET), poly(aryl-ether-ether-ketone) (PEEK), poly(chloro-trifluoroethylene), poly(carbonate), poly(sulfone), poly(methylmethacrylate)(PMMA), a poly(cyanurate), or an amorphous epoxy.

3. The process according to claim 1 wherein the glass transition point is greater than 70° C.

4. The process according to claim 3 wherein the radiation exposure is greater than 1.8 watts/cm$^2$.

5. The process according to claim 4 wherein the radiation exposure is between 3.5 and 10 watts/cm$^2$.

6. The process to according to claim 4 wherein the film is exposed to radiation for between 10 and 100 seconds.

7. The process according to claim 6 wherein the film is exposed to radiation for between 10 and 30 seconds.

8. The process according to claim 6 wherein the film is poly(ethyleneterephthalate).

9. The process according to claim 6 wherein the film is poly(aryl-ether-ether-ketone).

10. The process according to claim 6 wherein the film is poly(chlorotrifluoroethylene).

11. The process according to claim 6 wherein the film is bisphenol A dicyanate.

12. The process according to claim 6 wherein the film is amorphous epoxy.

13. The process according to claim 6 wherein the film is poly(carbonate).

14. The process according to claim 6 the film is poly(sulfone).

15. The process according to claim 6 wherein the film is poly(methylmethacrylate).

16. The process according to claim 4 wherein the mask comprises a transparent portion and an opaque portion, an image formed in the opaque portion which permits radiation to pass through the opaque portion, the opaque portion is in contact with the film and the opaque portion acts as both a heat sink and a block for radiation.

17. The process according to claim 4 wherein the polymer film is covered but is not in contact with the mask, whereby the mask blocks radiation, but heat dissipation of the non-irradiated regions is achieved by ambient air cooling.

18. The process according to claim 4 wherein a metal layer is applied to the film after the impressions are formed.

19. The process according to claim 18 wherein the film is protected by a protective layer of an optically clear protective covering applied over the metal layer.

20. The process according to claim 6 wherein the film is on a supporting substrate which prevents the film from being distorted.

21. The process according to claim 20 wherein the film and the supporting substrate are formed from the same material.

22. The process according to claim 19 wherein the film and the protective layer are formed from the same polymeric material.

23. The process according to claim 16 wherein the opaque portion is gold.

24. The process of claim 1, wherein said amorphous film exists in a stable amorphous state throughout a range of temperatures extending from arctic temperatures to desert temperatures.

* * * * *